(12) United States Patent
Zhang et al.

(10) Patent No.: US 9,112,531 B2
(45) Date of Patent: Aug. 18, 2015

(54) SYSTEMS AND METHODS FOR ENHANCED LOCAL ITERATION RANDOMIZATION IN A DATA DECODER

(71) Applicant: LSI Corporation, Milpitas, CA (US)

(72) Inventors: Fan Zhang, Milpitas, CA (US); Wu Chang, Santa Clara, CA (US); Shaohua Yang, San Jose, CA (US); Ming Jin, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 256 days.

(21) Appl. No.: 13/652,012

(22) Filed: Oct. 15, 2012

(65) Prior Publication Data
US 2014/0108880 A1    Apr. 17, 2014

(51) Int. Cl.
| H03M 13/05 | (2006.01) |
| H03M 13/00 | (2006.01) |
| H03M 13/11 | (2006.01) |
| H03M 13/41 | (2006.01) |

(52) U.S. Cl.
CPC ........ *H03M 13/1128* (2013.01); *H03M 13/114* (2013.01); *H03M 13/1137* (2013.01); *H03M 13/1142* (2013.01); *H03M 13/6331* (2013.01); *H03M 13/6343* (2013.01); *H03M 13/41* (2013.01)

(58) Field of Classification Search
None
See application file for complete search history.

(56) References Cited

U.S. PATENT DOCUMENTS

| 4,553,221 | A | 11/1985 | Hyatt |
| 5,278,703 | A | 1/1994 | Rub et al. |
| 5,278,846 | A | 1/1994 | Okayama |
| 5,317,472 | A | 5/1994 | Schweitzer, III |
| 5,325,402 | A | 6/1994 | Ushirokawa |
| 5,392,299 | A | 2/1995 | Rhines |
| 5,417,500 | A | 5/1995 | Martinie |
| 5,450,253 | A | 9/1995 | Seki |
| 5,513,192 | A | 4/1996 | Janku |
| 5,523,903 | A | 6/1996 | Hetzler |
| 5,550,810 | A | 8/1996 | Monogioudis et al. |
| 5,550,870 | A | 8/1996 | Blaker |
| 5,612,964 | A | 3/1997 | Haraszti |

(Continued)

FOREIGN PATENT DOCUMENTS

| JP | 2001/319433 A | 11/2001 |
| WO | WO 2010/059264 A1 | 5/2010 |
| WO | WO 2010/126482 A1 | 11/2010 |

OTHER PUBLICATIONS

U.S. Appl. No. 13/426,714, filed Mar. 22, 2012, Shaohua Yang.

(Continued)

*Primary Examiner* — Justin R Knapp
(74) *Attorney, Agent, or Firm* — Hamilton DeSanctis & Cha

(57) ABSTRACT

Systems and methods for data processing particularly related local iteration randomization in a data decoding circuit. In some cases a data processing system may include: a layered data decoding circuit, a value generator circuit, and a selector circuit. The layered data decoding circuit is configured to iteratively apply a data decoding algorithm up to a selected number of times to a decoder input to yield a decoded output in accordance with a layer order. The value generator circuit is operable configured to generate an adjusted number of times where the adjusted number of times is less than a default number of times. The selector circuit is operable configured to select one of the default number of times and the adjusted number of times as the selected number of times.

24 Claims, 4 Drawing Sheets

(56) References Cited

U.S. PATENT DOCUMENTS

| | | | |
|---|---|---|---|
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccallissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | Mccallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,412,088 B1 | 6/2002 | Patapoutian et al. | |
| 6,473,878 B1 | 10/2002 | Wei | |
| 6,535,553 B1 | 3/2003 | Limberg et al. | |
| 6,625,775 B1 | 9/2003 | Kim | |
| 6,748,034 B2 | 6/2004 | Hattori | |
| 6,757,862 B1 | 6/2004 | Marianetti, II | |
| 6,785,863 B2 | 8/2004 | Blankenship | |
| 6,810,502 B2 | 10/2004 | Eidson | |
| 6,970,511 B1 | 11/2005 | Barnette | |
| 6,975,692 B2 | 12/2005 | Razzell | |
| 6,986,098 B2 | 1/2006 | Poeppelman | |
| 7,035,327 B2 | 4/2006 | Nakajima et al. | |
| 7,047,474 B2 | 5/2006 | Rhee | |
| 7,058,873 B2 | 6/2006 | Song et al. | |
| 7,073,118 B2 | 7/2006 | Greenberg | |
| 7,093,179 B2 | 8/2006 | Shea | |
| 7,117,427 B2 | 10/2006 | Ophir | |
| 7,133,228 B2 | 11/2006 | Fung | |
| 7,136,244 B1 | 11/2006 | Rothberg | |
| 7,184,486 B1 | 2/2007 | Wu | |
| 7,191,378 B2 | 3/2007 | Eroz | |
| 7,203,887 B2 | 4/2007 | Eroz | |
| 7,237,181 B2 | 6/2007 | Richardson | |
| 7,308,061 B1 | 12/2007 | Huang | |
| 7,310,768 B2 | 12/2007 | Eidson | |
| 7,313,750 B1 | 12/2007 | Feng | |
| 7,370,258 B2 | 5/2008 | Iancu | |
| 7,415,651 B2 | 8/2008 | Argon | |
| 7,502,189 B2 | 3/2009 | Sawaguchi | |
| 7,523,375 B2 | 4/2009 | Spencer | |
| 7,587,657 B2 | 9/2009 | Haratsch | |
| 7,590,168 B2 | 9/2009 | Raghavan | |
| 7,596,196 B1 | 9/2009 | Liu et al. | |
| 7,646,829 B2 | 1/2010 | Ashley | |
| 7,702,986 B2 | 4/2010 | Bjerke | |
| 7,752,523 B1 | 7/2010 | Chaichanavong | |
| 7,779,325 B2 | 8/2010 | Song | |
| 7,802,172 B2 | 9/2010 | Casado | |
| 7,952,824 B2 | 5/2011 | Dziak | |
| 7,958,425 B2 | 6/2011 | Chugg | |
| 7,996,746 B2 | 8/2011 | Livshitz | |
| 8,018,360 B2 | 9/2011 | Nayak | |
| 8,020,078 B2 | 9/2011 | Richarson | |
| 8,161,361 B1 | 4/2012 | Song et al. | |
| 8,201,051 B2 | 6/2012 | Tan | |
| 8,225,168 B2 | 7/2012 | Yu et al. | |
| 8,237,597 B2 | 8/2012 | Liu | |
| 8,261,171 B2 | 9/2012 | Annampedu | |
| 8,291,284 B2 | 10/2012 | Savin | |
| 8,291,299 B2 | 10/2012 | Li | |
| 8,295,001 B2 | 10/2012 | Liu | |
| 8,555,140 B2* | 10/2013 | Gunnam et al. | 714/758 |
| 8,621,312 B2* | 12/2013 | Sutskover | 714/752 |
| 8,650,457 B1* | 2/2014 | Yeo | 714/758 |
| 8,656,249 B2* | 2/2014 | Chen et al. | 714/758 |
| 2002/0067780 A1 | 6/2002 | Razzell | |
| 2003/0123364 A1 | 7/2003 | Nakajima et al. | |
| 2003/0147168 A1 | 8/2003 | Galbraith et al. | |
| 2004/0194007 A1 | 9/2004 | Hocevar | |
| 2005/0243456 A1 | 11/2005 | Mitchell et al. | |
| 2006/0002689 A1 | 1/2006 | Yang et al. | |
| 2007/0297496 A1 | 12/2007 | Park et al. | |
| 2008/0037676 A1 | 2/2008 | Kyun et al. | |
| 2008/0069373 A1 | 3/2008 | Jiang | |
| 2008/0304558 A1 | 12/2008 | Zhu et al. | |
| 2009/0132893 A1 | 5/2009 | Miyazaki | |
| 2009/0177852 A1 | 7/2009 | Chen | |
| 2009/0185643 A1 | 7/2009 | Fitzpatrick | |
| 2010/0172046 A1 | 7/2010 | Liu et al. | |
| 2010/0322048 A1 | 12/2010 | Yang et al. | |
| 2011/0167227 A1 | 7/2011 | Yang | |
| 2011/0264987 A1 | 10/2011 | Li | |
| 2012/0124118 A1 | 5/2012 | Ivkovic | |
| 2012/0182643 A1 | 7/2012 | Zhang | |
| 2012/0207201 A1 | 8/2012 | Xia | |
| 2012/0212849 A1 | 8/2012 | Xu | |
| 2012/0219071 A1* | 8/2012 | Markman et al. | 375/240.25 |
| 2012/0262814 A1 | 10/2012 | Li | |
| 2012/0265488 A1 | 10/2012 | Sun | |
| 2013/0326302 A1* | 12/2013 | Han et al. | 714/752 |
| 2013/0346824 A1* | 12/2013 | Bolotov et al. | 714/755 |
| 2014/0053037 A1* | 2/2014 | Wang et al. | 714/752 |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

(56) References Cited

OTHER PUBLICATIONS

Patapoutian et al "Improving Re-Read Strategies by Waveform Averaging" IEEE Transactions on Mag. vol. 37 No. 6, Nov. 2001.
Richardson, T "Error Floors of LDPC Codes" Flarion Technologies Bedminster NJ 07921, tjr@flarion.com (not dated).
Shokrollahi "LDPC Codes: An Introduction", Digital Fountain, Inc. (Apr. 2, 2003).
Spagnol et al, "Hardware Implementation of GF(2m) LDPC Decoders", IEEE Transactions on Circuits and Systemsši: Regular Papers, vol. 56, No. 12 (Dec. 2009).
Tehrani et al., "Fully Parallel Stochastic LDPC Decoders", IEEE Transactions on Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/174,537, filed Jun. 30, 2011, Anantha Raman Krishnan, Unpublished.
U.S. Appl. No. 13/213,751, filed Aug. 19, 2011, Fan Zhang, Unpublished.
U.S. Appl. No. 13/283,549, filed Oct. 27, 2011, Wu Chang, Unpublished.
U.S. Appl. No. 13/300,078, filed Nov. 18, 2011, Chung-Li Wang, Unpublished.
U.S. Appl. No. 13/305,510, filed Nov. 28, 2011, Lei Chen, Unpublished.
U.S. Appl. No. 13/227,416, filed Sep. 7, 2011, Lei Chen, Unpublished.
U.S. Appl. No. 13/296,022, filed Nov. 14, 2011, Victor Krachkovsky, Unpublished.
U.S. Appl. No. 13/180,495, filed Jul. 11, 2011, Chung-Li Wang, Unpublished.
U.S. Appl. No. 13/174,453, filed Jun. 30, 2011, Johnson Yen, Unpublished.
U.S. Appl. No. 13/171,615, filed Jun. 29, 2011, Bradley D. Seago, Unpublished.
U.S. Appl. No. 13/113,219, filed May 23, 2011, Yang Han, Unpublished.
U.S. Appl. No. 13/186,234, filed Jul. 19, 2011, Haitao Xia, Unpublished.
U.S. Appl. No. 13/305,551, filed Nov. 28, 2011, Yang Han, Unpublished.
U.S. Appl. No. 13/596,819, filed Aug. 28, 2012, Shaohua Yang, Unpublished.
U.S. Appl. No. 13/422,986, filed Mar. 16, 2012, Fan Zhang, Unpublished.
U.S. Appl. No. 13/415,326, filed Mar. 8, 2012, Shaohua Yang, Unpublished.
U.S. Appl. No. 13/239,683, filed Sep. 22, 2011, Changyou Xu, Unpublished.
U.S. Appl. No. 13/426,693, filed Mar. 22, 2012, Shaohua Yang, Unpublished.
U.S. Appl. No. 13/302,119, filed Nov. 22, 2011, Lei Chen, Unpublished.
U.S. Appl. No. 13/483,105, filed May 30, 2012, Xuebin Wu, Unpublished.
U.S. Appl. No. 13/433,693, filed Mar. 29, 2012, Fan Zhang, Unpublished.
U.S. Appl. No. 13/545,833, filed Jul. 10, 2012, Zhi Bin Li, Unpublished.
U.S. Appl. No. 13/372,580, filed Feb. 14, 2012, Fan Zhang, Unpublished.
U.S. Appl. No. 13/596,947, filed Aug. 28, 2012, Fan Zhang, Unpublished.
U.S. Appl. No. 13/596,978, filed Aug. 28, 2012, Fan Zhang, Unpublished.
U.S. Appl. No. 13/597,001, filed Aug. 28, 2012, Fan Zhang, Unpublished.
U.S. Appl. No. 13/619,907, filed Sep. 14, 2012, Fan Zhang, Unpublished.
U.S. Appl. No. 13/621,341, filed Sep. 17, 2012, Shaohua Yang, Unpublished.
U.S. Appl. No. 13/415,430, filed Mar. 8, 2012, Nayak Ratnakar Aravind, Unpublished.
U.S. Appl. No. 13/483,100, filed May 30, 2012, Fan Zhang, Unpublished.
U.S. Appl. No. 13/445,848, filed Apr. 12, 2012, Bruce Wilson, Unpublished.
U.S. Appl. No. 13/284,730, filed Oct. 28, 2011, Fan Zhang, Unpublished.
U.S. Appl. No. 13/269,852, filed Oct. 10, 2011, Haitao Xia, Unpublished.
U.S. Appl. No. 13/369,468, filed Feb. 9, 2012, Zongwang Li, Unpublished.
U.S. Appl. No. 13/340,951, filed Dec. 30, 2011, Lei Chen, Unpublished.
U.S. Appl. No. 13/474,660, filed May 17, 2012, Zongwang Li, Unpublished.
U.S. Appl. No. 13/284,767, filed Oct. 28, 2011, Fan Zhang, Unpublished.
U.S. Appl. No. 13/295,150, filed Nov. 14, 2011, Zongwang Li, Unpublished.
U.S. Appl. No. 13/269,832, filed Oct. 10, 2011, Haitao Xia, Unpublished.
U.S. Appl. No. 13/340,974, filed Dec. 30, 2011, Dan Liu, Unpublished.
U.S. Appl. No. 13/327,279, filed Dec. 15, 2011, Wei Feng, Unpublished.
U.S. Appl. No. 13/445,878, filed Apr. 12, 2012, Yu Liao, Unpublished.
U.S. Appl. No. 13/316,741, filed Dec. 12, 2011, Yang Han, Unpublished.
U.S. Appl. No. 13/316,858, filed Dec. 12, 2011, Zongwang Li, Unpublished.
U.S. Appl. No. 13/362,409, filed Jan. 31, 2012, Fan Zhang, Unpublished.
U.S. Appl. No. 13/412,520, filed Mar. 5, 2012, Fan Zhang, Unpublished.
U.S. Appl. No. 13/227,544, filed Sep. 8, 2011, Shaohua Yang, Unpublished.
U.S. Appl. No. 13/426,714, filed Mar. 22, 2012, Shaohua Yang, Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR ENHANCED LOCAL ITERATION RANDOMIZATION IN A DATA DECODER

BACKGROUND

Embodiments are related to systems and methods for data processing, and more particularly to systems and methods for data decoding.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. Depending upon a number of factors, different data sets require more or fewer iterations through the data detector circuit and/or the data decoder circuit. In some cases, a data set being processed through a data processing circuit will not converge regardless of the number of iterations through the data detector circuit and/or the data decoder circuit due to trapping conditions in the data set.

Hence, for at least the aforementioned reasons, there exists a need in the art for advanced systems and methods for data processing.

BRIEF SUMMARY

Embodiments are related to systems and methods for data processing, and more particularly to systems and methods for data decoding.

Various embodiments of the present invention provide data processing systems that include a layered data decoding circuit, a value generator circuit, and a selector circuit. The layered data decoding circuit is operable to iteratively apply a data decoding algorithm up to a selected number of times to a decoder input to yield a decoded output in accordance with a layer order. The value generator circuit operable to generate an adjusted number of times that is less than a default number of times. The selector circuit is operable to select one of the default number of times and the adjusted number of times as the selected number of times, and to fix the layer order when the adjusted number of times is provided as the selected number of times.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION

Figure 1:
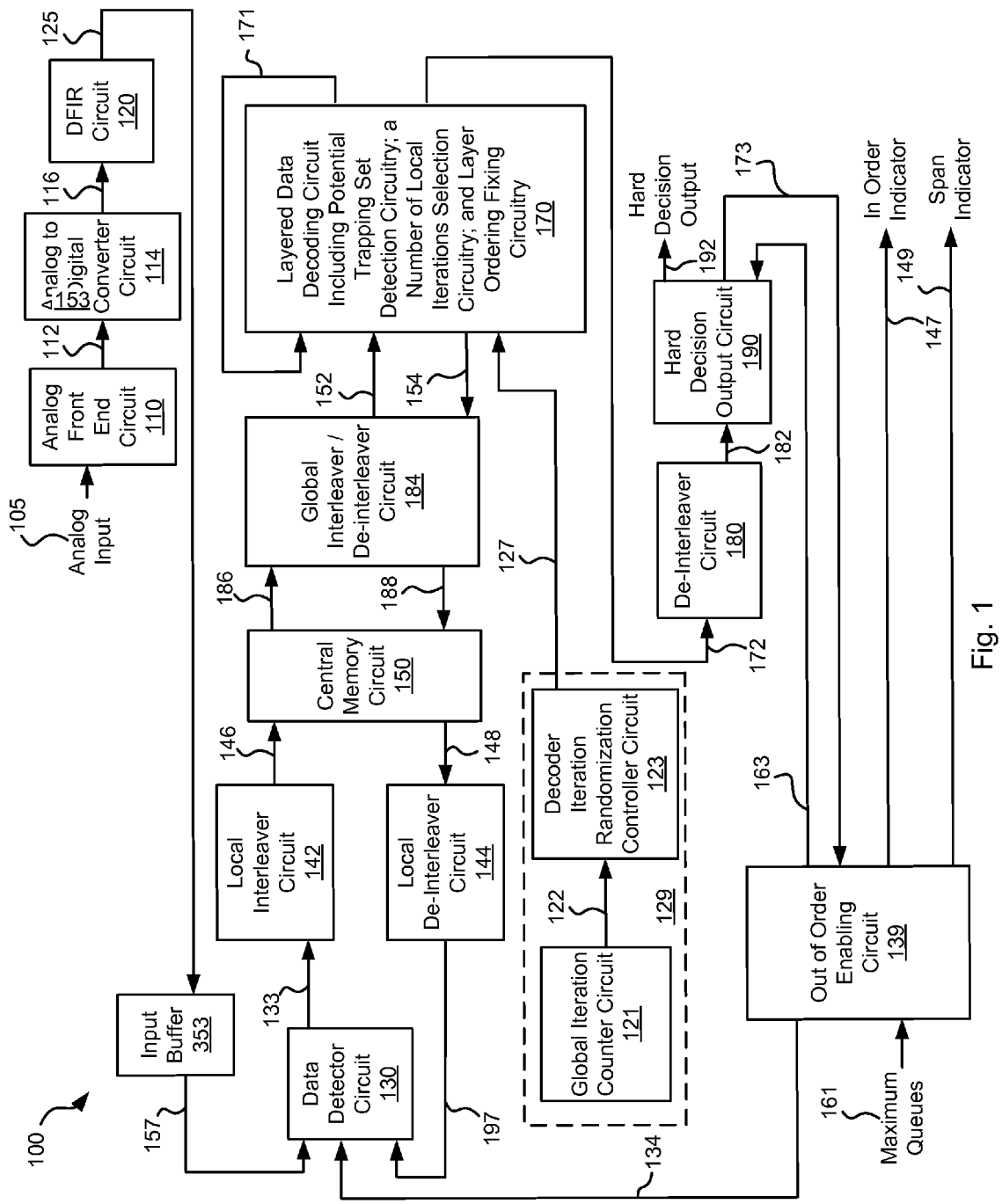
FIG. 1 shows a data processing circuit including a decoder iteration randomization circuit interacting with a layered data decoding circuit in accordance with some embodiments of the present invention.

Embodiments are related to systems and methods for data processing, and more particularly to systems and methods for data decoding.

Iterative data processing may include a data detector circuit that applies a data detection algorithm to a data set to yield a detected output, and a data decoder circuit that applies a data decoding algorithm to a decoder input derived from the detected output to yield a decoded output. The process of passing data through both the data detector circuit and the data decoder circuit is referred to herein as a "global iteration". During each global iteration, the data decoding algorithm may be repeatedly applied to a processing data set. This reapplication of the data decoding algorithm is referred to herein as a "local iteration". In particular embodiments of the present invention, a default number of ten local iterations are allowed for each global iteration. Based upon the disclosure provided herein, one of ordinary skill in the art will recognize a variety of numbers of local iterations that may be used as a default in relation to different embodiments of the present invention. In some circuits where out of order result reporting is allowed, a large number of global iterations (e.g., 120) for a given data set may be supported. It has been discovered that some data sets will enter a repeating loop where the values repeated as the decoded output may not change from one global iteration to the next even though errors remain in the decoded output.

To disrupt the aforementioned error repetition and allow the errors remaining in the decoded output to be resolved, embodiments of the present invention selectively adjust the number of local iterations allowed through the data decoder circuit. This modification from the default number of allowable local iterations has been found to perturb the data processing sufficient to disrupt the error repetition and allow errors remaining in a decoded output to be resolved on subsequent processing iterations. As part of modifying the default number of allowable local iterations, the layering of the decoding process is controlled.

Various embodiments of the present invention provide data processing systems that include a layered data decoding circuit, a value generator circuit, and a selector circuit. The layered data decoding circuit is operable to iteratively apply a data decoding algorithm up to a selected number of times to a decoder input to yield a decoded output in accordance with a layer order. The value generator circuit operable to generate an adjusted number of times that is less than a default number of times. The selector circuit is operable to select one of the default number of times and the adjusted number of times as the selected number of times, and to fix the layer order when the adjusted number of times is provided as the selected number of times. In some instances of the aforementioned embodiments, the data processing system further includes a trapping set detection circuit operable to identify a potential trapping set in the decoder output. In some cases, the adjusted number of times is selected as the selected number of times and the layer order is fixed based at least in part on identification of the potential trapping set.

In various instances of the aforementioned embodiments, the value generator circuit is operable to generate a random value provided as the adjusted number of times. In some such instances, the default number of times is provided as the adjusted number of times for a first processing period, and the random value is provided as the adjusted number of times for a second processing period. In one or more instances of the aforementioned embodiments, the data processing system further includes a data detector circuit operable to apply a data detection algorithm to a data input to yield a detected output. The decoder input is derived from the detected output, and processing by both the data detector circuit and the data decoder circuit is a global iteration. In some such instances, the data detector circuit may be, but is not limited to, a Viterbi algorithm data detector circuit, or a maximum a posteriori data detector circuit. In one or more such instances, the value generator circuit is operable to generate a value based upon a current number of global iterations, and to provide the value as the adjusted number of times. IN one case, the default number of times default value is provided as the adjusted number of times for a first processing period, and wherein the value is provided as the adjusted number of times for a second processing period. In some cases, the first processing period is between a first number of global iterations and a second number of global iterations, and wherein the second processing period occurs after the second number of global iterations.

Other embodiments of the present invention provide methods for data processing. The methods include: iteratively applying a data decoding algorithm by a layered data decoding circuit to a data set up to a selected number of times to yield a decoded output in accordance with a layer order; generating an adjusted number of times; selecting one of a default number of times and the adjusted number of times as the selected number of times; and fixing the layer order to a defined order based at least in part on selecting the adjusted number of times. In some instances of the aforementioned embodiments, the methods further include identifying a potential trapping set in the decoder output, and based at least in part on the identified potential trapping set, selecting the adjusted number of times as the selected number of times, and fixing the layer order.

FIG. 1 shows a data processing circuit 100 including a decoder iteration randomization circuit 129 (shown in dashed lines) interacting with a layered data decoding circuit 170 in accordance with some embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. It may be possible that equalized output 125 may be received directly from a storage device in, for example, a solid state storage system. In such cases, analog front end circuit 110, analog to digital converter circuit 114 and equalizer circuit 120 may be eliminated where the data is received as a digital data input. Equalized output 125 is stored to an input buffer 153 that includes sufficient memory to maintain one or more codewords until processing of that codeword is completed through a data detector circuit 130 and a data decoding circuit 170 including, where warranted, multiple global iterations (passes through both data detector circuit 130 and data decoding circuit 170) and/or local iterations (passes through data decoding circuit 170 during a given global iteration). An output 157 is provided to data detector circuit 130.

Data detector circuit 130 may be a single data detector circuit or may be two or more data detector circuits operating in parallel on different codewords. Whether it is a single data detector circuit or a number of data detector circuits operating in parallel, data detector circuit 130 is operable to apply a data detection algorithm to a received codeword or data set. In some embodiments of the present invention, data detector circuit 130 is a Viterbi algorithm data detector circuit as are known in the art. In other embodiments of the present invention, data detector circuit 130 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 130 is used to apply the data detection algorithm to the received codeword for a first global iteration applied to the received codeword, and another data detector circuit included in data detector circuit 130 is operable apply the data detection algorithm to the received codeword guided by a decoded output accessed from a central memory circuit 150 on subsequent global iterations.

Upon completion of application of the data detection algorithm to the received codeword on the first global iteration, data detector circuit 130 provides a detector output 133. Detector output 133 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 133 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150.

Once a data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 to layered data decoding circuit 170. Layered data decoding circuit 170 applies a data decoding algorithm one layer after another. In some embodiments of the present invention, the order of the layers of decoding are selected in a defined order or in a pseudo-random order during standard processing. Examples of such layered decoding is provided in U.S. patent application Ser. No. 13/227,416 entitled "Multi-Level LDPC Layer Decoder" filed by Chen et al. on Sep. 7, 2011. The aforementioned patent application is assigned to an entity common hereto, and the entirety of the aforementioned reference is incorporated herein by reference for all purposes.

In addition, layered data decoding circuit 170 includes potential trapping set detection circuitry. In some embodiments of the present invention, a potential trapping set is identified whenever a stable periodically repeating pattern appears across consecutive local iterations of a non-converging data sets. In one particular embodiment of the present invention, such a stable periodically repeating pattern is found where the number of unsatisfied checks remaining after a given local iteration is less than a defined threshold, and the same unsatisfied checks are reported at the end of a defined number of local iterations. As an example, a potential trapping set may be identified where the number of remaining unsatisfied checks is five (5) or less, and the same set of unsatisfied checks have been reported at the end of three consecutive local iterations of layered data decoding circuit 170. Based upon the disclosure provided herein, one of ordinary skill in the art will recognize other approaches for identifying a potential trapping set, and/or other qualities indicative of a potential trapping set.

In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Layered data decoding circuit 170 applies a data decode algorithm to decoder input 152 to yield a decoded output 171. In cases where another local iteration (i.e., another pass trough data decoder circuit 170) is desired, data decoding circuit 170 re-applies the data decode algorithm to decoder input 152 guided by decoded output 171. This continues until either a maximum number of local iterations is exceeded or decoded output 171 converges.

The maximum number of local iterations that may be applied during any given global iteration is controlled by decoder iteration randomization circuit 129. Decoder iteration randomization circuit 129 includes a global iteration counter circuit 121 that is operable to count the number of global iterations that have been applied to the data set currently processing through data decoder circuit 170. The number of global iterations is provided as a global iteration count 122 to a decoder iteration randomization controller circuit 123. Decoder randomization controller circuit 123 applies a number generator algorithm designed to generate a maximum local iteration value 127 that is provided to layered data decoding circuit 170.

When layered data decoding circuit 170 identifies a potential trapping set, the order of the layered decoding is fixed and the maximum number of local iterations is set equal to maximum local iteration value 127. In some cases, the layered decoding is set to decode layers in a different order than a used in the previous local iteration. In other cases, the layered decoding is set to decode layers in the same order as the previous local iteration, but the order is fixed. Layered data decoding circuit 170 then operates to apply the number of local iterations of the data decoding algorithm up to the value provided as maximum local iteration value 127. The aforementioned process for randomising the number of local iterations is set forth below in the following pseudocode:

```
If (potential trapping set is identified by layered data decoding circuit
170){
    fix the layer ordering in the layered data decoding circuit;
    set the number of local iterations equal to maximum local iteration
    value 127; apply local iterations up to the number of local iterations
}
Else {
    use default layer ordering in the layered data decoding circuit;
    use default number of local iterations;
    apply one more local iteration
}
```

In some embodiments of the present invention, decoder randomization controller circuit 123 applies a pseudo random value generation algorithm. Such a pseudo random value generation algorithm may operate consistent with the following pseudocode:

```
If (global iteration count 122 is less than or equal to Defined Level){
    maximum local iteration value 127 = Default Value
}
Else If (global iteration count 122 is greater than Defined Level){
    maximum local iteration value 127 =
    maximum local iteration value 127+[(global iteration count 122 −
    Offset + Modifier) modulo Divider] − Modifier
}
```

In one particular embodiment of the present invention, the Default Value is ten (10), the Defined Level is twenty eight (28), the Offset is twenty seven (27), the Divider is eighteen (18), and the Modifier is eight (8). The values of the Default Value, the Defined Level, the Offset, the Divider, and the Modifier may be changed to match the particular needs of a given embodiment of the present invention.

In other embodiments of the present invention, decoder randomization controller circuit 123 applies a true random value generation algorithm. Such a true random value generation algorithm may operate consistent with the following pseudocode:

```
If (global iteration count 122 is less than or equal to Defined Level){
    maximum local iteration value 127 = Default Value
}
Else If (global iteration count 122 is greater than Defined Level){
    maximum local iteration value 127 =
        maximum local iteration value 127+[random( ) modulo
        Divider] – Modifier
}
``` where random( ) is the output of a random number generator circuit. Such a random number generator circuit may be implemented, for example, as a free running counter. In one particular embodiment of the present invention, the Default Value is ten (10), the Defined Level is twenty eight (28), the Offset is twenty seven (27), the Divider is eighteen (18), and the Modifier is eight (8). The values of the Default Value, the Defined Level, the Offset, the Divider, and the Modifier may be changed to match the particular needs of a given embodiment of the present invention.

In yet other embodiments of the present invention, decoder randomization controller circuit 123 applies a targeted random value generation algorithm. Such a targeted random value generation algorithm relies on simulation of data processing circuit 100 to reveal which values of maximum local iteration value 127 are likely to yield the better results. The numbers of local iterations likely to yield improved results are programmed into an array, $A=\{I_0, I_0, I_1, I_1, I_2, I_2, I_3, I_3, I_4, I_3\}$, where each of $I_0, I_1, I_2, I_3, I_4$ indicate a number of local iterations. As just one example, the array A may have the following values: $A=\{2, 2, 4, 4, 5, 5, 6, 6, 8, 8\}$. Once this is established, one of the values of A is randomly selected. The targeted random value generation algorithm may operate consistent with the following pseudocode:

```
If (global iteration count 122 is less than or equal to Defined Level){
    maximum local iteration value 127 = Default Value
}
Else If (global iteration count 122 is greater than Defined Level){
    maximum local iteration value 127 = A[random( )]
}
``` where random( ) is the output of a random number generator circuit having a random value between zero and the Default Value. Such a random number generator circuit may be implemented, for example, as a free running counter. The value from random( ) serves as an index into the array A. In one particular embodiment of the present invention, the Default Value is ten (10), and the Defined Level is one hundred (100). The values of the Default Value, and the Defined Level may be changed to match the particular needs of a given embodiment of the present invention.

Where decoded output 171 fails to converge (i.e., fails to yield the originally written data set) and a number of local iterations through layered data decoding circuit 170 exceeds maximum local iteration value 127, the resulting decoded output is provided as a decoded output 154 back to central memory circuit 150 where it is stored awaiting another global iteration through a data detector circuit included in data detector circuit 130. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. When a data detector circuit included in data detector circuit 130 becomes available, a previously stored de-interleaved output 188 accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set previously received as equalized output 125.

Alternatively, where the decoded output converges (i.e., yields the originally written data set), the resulting decoded output is provided as an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

In some cases, a recipient (not shown) of hard decision output 192 includes some ability to receive data sets out of order. This ability to receive data sets out of order is provided from the recipient device as a maximum queues input 161 from the recipient. Where the maximum queues input 161 is zero it indicates that the recipient cannot accept data sets out of order as there is no extra buffering available. In such a case, an out of order enabling circuit 139 asserts an order enable output 163 to hard decision output circuit 190 such that out of order result reporting is disabled. In such a case, a completed data set remains in hard decision output circuit 190 until all previous data sets in a requested block of data have completed. When one or more data sets are in order in hard decision output circuit 190 they are provided to a recipient as hard decision output 192 and an order status signal 173 is asserted to out of order enabling circuit 139 indicating that data being reported is in order. As the in order data sets are being provided from hard decision output circuit 190 as hard decision output 192 to the recipient out of order enabling circuit 139 asserts an in order indicator 147 such that the recipient understands that the provided data is being provided in an ordered sequence. In addition, a span indicator 149 is set equal to zero by out of order enabling circuit 139. Setting span indicator 149 to zero indicates that there are no intervening data sets between the data sets provided as hard decision output 192.

In contrast, when maximum queues input 161 is greater than zero it indicates that the recipient can accept at least one group of data sets out of order and is prepared with sufficient buffering to handle to additional out of order group(s). In such a case, an out of order enabling circuit 139 asserts order enable output 163 to hard decision output circuit 190 such that out of order result reporting is enabled. In such a case, a completed data set is immediately provided to the recipient from hard decision output circuit 190 as hard decision output 192. Where the next data set is to be provided from hard decision output circuit 190 as an out of order output, hard decision output circuit 190 asserts order status signal 173 to out of order enabling circuit 139 such that the out of order results are indicated. As the out of order data set is being provided from hard decision output circuit 190 as hard decision output 192 to the recipient, out of order enabling circuit 139 asserts in order indicator 147 such that the recipient understands that the provided data is being provided in an out of order sequence. In addition, a span indicator 149 is set equal to a number of data sets that are missing between the currently reported out of order data set and the previously reported data set. Alternatively, where the next data set is to be provided from hard decision output circuit 190 as an in order output, hard decision output circuit 190 asserts order status signal 173 to out of order enabling circuit 139 such that the in order results are indicated. As the in order data set is being provided from hard decision output circuit 190 as hard decision output 192 to the recipient, out of order enabling circuit 139 asserts in order indicator 147 such that the recipient understands that the provided data is being provided in an in order sequence. In addition, a span indicator 149 is set equal to zero by out of order enabling circuit 139. Setting span indicator 149 to zero indicates that there are no intervening data sets between the data sets provided as hard decision output 192.

Pseudocode describing the data reporting processes governed by hard decision output circuit 190 and out of order enabling circuit 139 is set forth below.

```
If (Data Set Available in Hard Decision Output Circuit 190){
    If(Data Set is In Order From the Last Transferred Data Set){
        Provide Data Set as Hard Decision Output 192;
        Assert In Order Indicator 147 to indicate an in order transfer;
        Set Span Indicator 147 as Zero;
    }
    Else If(Data Set is Out of Order From the Last Transferred Data Set){
        If(Maximum Queues 161 is Equal to Zero){
            Hold the Data Set in the Hard Decision Output Circuit 190
        }
        Else If(Maximum Queues 161 is Greater than Zero){
            Provide Data Set as Hard Decision Output 192;
            Assert In Order Indicator 147 to indicate an out of order transfer;
            Calculate a Number of Data Sets Between the Current Data Set and
            the Previously Transferred Data Set;
            Set Span Indicator 147 as the Calculated Number
        }
    }
}
```

Figures 2A, 2C:
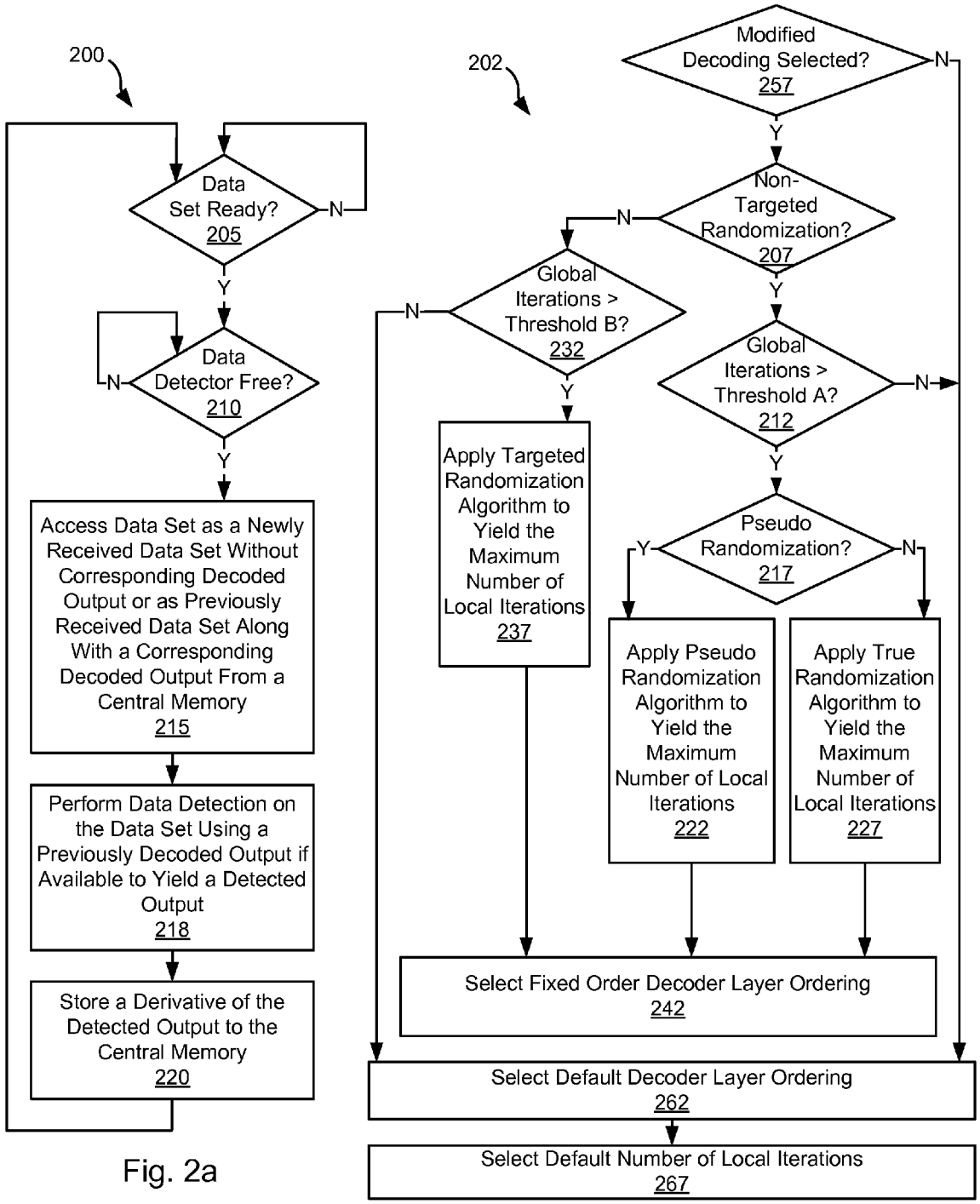
FIGS. 2a-2c are flow diagrams showing a method for data processing including decoder iteration randomization and layered decoding control in accordance with some embodiments of the present invention.
Figure 2B:
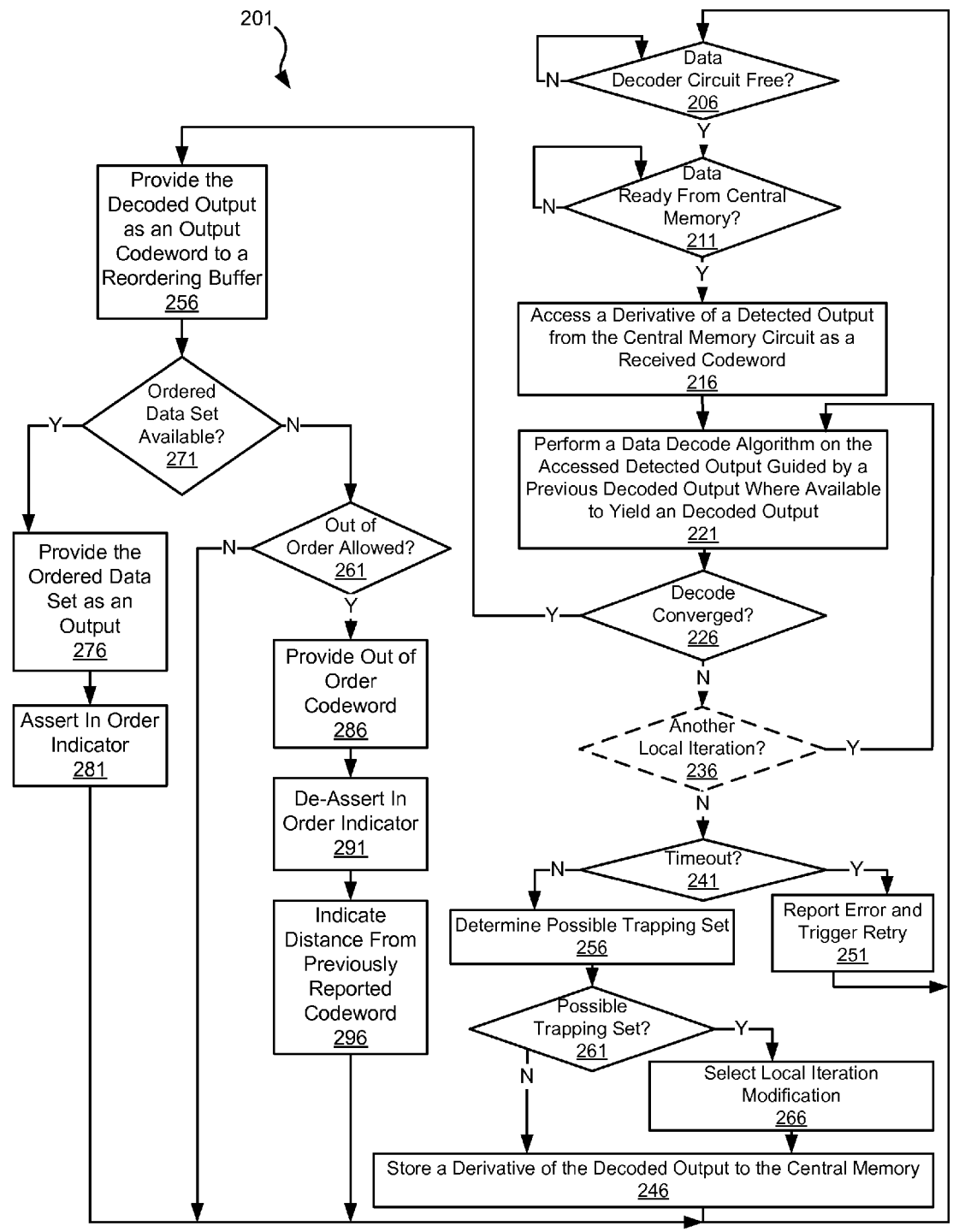

FIGS. 2a-2c are flow diagrams 200, 201, 202 showing a method for data processing including decoder iteration randomization and layered decoding control in accordance with some embodiments of the present invention. Following flow diagram 200, it is determined whether a data set is ready for application of a data detection algorithm (block 205). In some cases, a data set is ready when it is received from a data decoder circuit via a central memory circuit. In other cases, a data set is ready for processing when it is first made available from a front end processing circuit. Where a data set is ready (block 205), it is determined whether a data detector circuit is available to process the data set (block 210).

Where the data detector circuit is available for processing (block 210), the data set is accessed by the available data detector circuit (block 215). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 218). Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 220). The derivative of the detected output may be, for example, an interleaved or shuffled version of the detected output.

Following flow diagram 201 of FIG. 2b, it is determined whether a data decoder circuit is available (block 206) in parallel to the previously described data detection process of FIG. 2a. The data decoder circuit may be, for example, a layered data decoding circuit applying a low density parity check algorithm. It is then determined whether a data set is ready from the central memory (block 211). The data set is a derivative of the detected output stored to the central memory as described above in relation to block 220 of FIG. 2a. Where a data set is available in the central memory (block 211), a previously stored derivative of a detected output is accessed from the central memory and used as a received codeword (block 216). A data decode algorithm is applied to the received codeword to yield a decoded output (block 221). Where a previous local iteration has been performed on the received codeword, the results of the previous local iteration (i.e., a previous decoded output) are used to guide application of the decode algorithm. It is then determined whether the decoded output converged (e.g., resulted in the originally written data as indicated by the lack of remaining unsatisfied checks) (block 226).

Where the decoded output converged (block 226), it is provided as a decoded output codeword to a reordering buffer (block 256). It is determined whether the received output codeword is either sequential to a previously reported output codeword in which case reporting the currently received output codeword immediately would be in order, or that the currently received output codeword completes an ordered set of a number of codewords in which case reporting the completed, ordered set of codewords would be in order (block 271). Where the currently received output codeword is either sequential to a previously reported codeword or completes an ordered set of codewords (block 271), the currently received output codeword and, where applicable, other codewords forming an in order sequence of codewords are provided to a recipient as an output (block 276). As the codeword(s) are provided as the output (block 276), an in order indicator is asserted such that the recipient is informed that the transferring codewords are in order (block 281).

Where, on the other hand, the currently received output codeword is not in order or does not render an ordered data set complete (block 271), it is determined whether out of order result reporting is allowed (block 261). This may be determined, for example, by determining whether the value of a maximum queues input is greater than zero. Where out of order result reporting is not allowed (block 261), the process resets to block 206. Alternatively, where out of order result reporting is allowed (block 261), the currently received output codeword is provided as an output to the recipient (block 286). As the codeword is provided as the output (block 286), in order indicator is de-asserted such that the recipient is informed that the transferring codeword is out of order (block 291). In addition, a number of output codewords between the previously reported output codeword and the currently received output codeword is calculated as a span indicator, and the span indicator is provided as a distance to the recipient (block 296).

Alternatively, where the decoded output failed to converge (e.g., errors remain) (block 226), it is determined whether another local iteration is desired (block 236). Block 236 is shown in dashed lines indicating that it is a multiple block process set forth in flow diagram 202 of FIG. 2c that returns a maximum number of local iterations. Where the current number of local iterations does not exceed the maximum number of local iterations, the another local iteration is desired (block 236). Otherwise, where the current number of local iterations exceeds the maximum number of local iterations, the another local iteration is not desired (block 236). Where another local iteration is desired (block 236), the processes of blocks 221, 226, 236 are repeated using the results of the previous local iteration as a guide for the next iteration.

Alternatively, where another local iteration is not desired (block 236), it is determined whether a timeout condition has been met (block 241). This timeout condition may be, for example, an indication that too little memory resources remain in either an input buffer or the central memory of the data processing system such that additional processing of the currently processing codeword is not possible. The amount of available space in the central memory and an output memory reordering queue is a function of how many iterations are being used by concurrently processing codewords to converge. For more detail on the output queue time limitation see, for example, U.S. patent application Ser. No. 12/114,462 entitled "Systems and Methods for Queue Based Data Detection and Decoding", and filed May 8, 2008 by Yang et al. The entirety of the aforementioned reference is incorporated herein by reference for all purposes. Thus, the amount of time that a codeword may continue processing through global iterations is a function of the availability of an input buffer, a central memory and an output memory reordering queue. Based upon the disclosure provided herein, one of ordinary skill in the art will recognize a variety of timeout conditions that may occur. Where a timeout condition is not met (block 241), it is determined whether a possible trapping set has been identified (block 256). In some embodiments of the present invention, a potential trapping set is identified whenever a stable periodically repeating pattern appears across consecutive local iterations of a non-converging data sets. In one particular embodiment of the present invention, such a stable periodically repeating pattern is found where the number of unsatisfied checks remaining after a given local iteration is less than a defined threshold, and the same unsatisfied checks are reported at the end of a defined number of local iterations. As an example, a potential trapping set may be identified where the number of remaining unsatisfied checks is five (5) or less, and the same set of unsatisfied checks have been reported at the end of three consecutive local iterations of the layered data decoding circuit. Based upon the disclosure provided herein, one of ordinary skill in the art will recognize other approaches for identifying a potential trapping set, and/or other qualities indicative of a potential trapping set.

Where it is determined that a potential trapping set exists (block 261), local iteration modification is selected (block 266). In either case, a derivative of the decoded output is stored to the central memory where it is maintained until a data detector is available to begin a subsequent global iteration (block 246). Alternatively, where a timeout condition is met (block 241) an error is reported and a retry of the currently processing codeword is triggered (block 251).

Turning to FIG. 2c, flow diagram 202 shows a method for generating the maximum number of local iterations utilized in block 236 of flow diagram 201. Follow flow diagram 202, it is determined whether modified decoding is selected (block 257). Modified decoding is selected in block 266 of FIG. 2b where a possible trapping set is identified. Where modified decoding is not selected (block 257), default decoder layer ordering is selected (block 262). This default decoder layer ordering may be, for example, a pseudo-random ordering using different ordering on each global iteration, or may be a fixed ordering. In addition, the default number of local iterations is selected (block 267). In some embodiments of the present invention, the default number of local iterations is ten (10).

Alternatively, where modified decoding is selected (block 257), it is determined whether non-targeted randomization is desired (block 207). Non-targeted randomization allows for selecting any value for the maximum number of local iterations between a minimum value and a maximum value. In contrast, targeted randomization allows for selecting from only a subset of allowed values for the maximum number of local iterations. Where non-targeted randomization is selected (block 207), it is determined whether the number of global iterations that have been applied to the currently processing data set exceeds a threshold value (i.e., Threshold Value A) (block 212). Where the threshold has not been exceeded (block 212), default decoder layer ordering is selected (block 262), the default number of local iterations is selected (block 267). In some embodiments of the present invention, Threshold Value A is twenty-eight (28).

Alternatively, where the number of global iterations that have been applied to the currently processing data set exceeds the threshold value (block 212), it is determined whether pseudo randomization is desired (block 217). Where pseudo randomization is desired (block 217), a pseudo randomization algorithm is applied to yield the maximum number of global iterations for the current global iteration (block 222). In one particular embodiment of the present invention, the pseudo randomization algorithm is done in accordance with the following pseudocode:

maximum local iteration value=maximum local iteration value+[(global iteration count−Offset+Modifier)modulo Divider]−Modifier In one particular embodiment of the present invention, the Default Value is ten (10), the Threshold Value A is twenty eight (28), the Offset is twenty seven (27), the Divider is eighteen (18), and the Modifier is eight (8). The values of the Default Value, the Threshold Value A, the Offset, the Divider, and the Modifier may be changed to match the particular needs of a given embodiment of the present invention.

Alternatively, where pseudo randomization is not desired (block 217), a true randomization algorithm is applied to yield the maximum number of global iterations for the current global iteration (block 227). In one particular embodiment of the present invention, the true randomization algorithm is done in accordance with the following pseudocode:

maximum local iteration value=maximum local iteration value+[random( ) modulo Divider]−Modifier where random( ) is the output of a random number generator circuit. Such a random number generator circuit may be implemented, for example, as a free running counter. In one particular embodiment of the present invention, the Default Value is ten (10), the Threshold Value A is twenty eight (28), the Offset is twenty seven (27), the Divider is eighteen (18), and the Modifier is eight (8). The values of the Default Value, the Threshold Value A, the Offset, the Divider, and the Modifier may be changed to match the particular needs of a given embodiment of the present invention.

Where non-targeted randomization is not desired (block 207), it is determined whether the number of global iterations that have been applied to the currently processing data set exceeds a threshold value (i.e., Threshold Value B) (block 232). Where the threshold has not been exceeded (block 232), default decoder layer ordering is selected (block 262), the default number of local iterations is selected (block 267). In some embodiments of the present invention, the default value is ten (10), and Threshold Value B is one hundred (100).

Alternatively, where the threshold has been exceeded (block 232), a targeted randomization algorithm is applied to yield the maximum number of local iterations (block 237). In one particular embodiment of the present invention, such a targeted random value generation algorithm relies on simulation of a data processing circuit to reveal which values of a maximum local iteration value are likely to yield the better results. The numbers of local iterations likely to yield improved results are programmed into an array, $A = \{I_0, I_0, I_1, I_1, I_2, I_2, I_3, I_3, I_4, I_3\}$, where each of $I_0, I_1, I_2, I_3, I_4$ indicate a number of local iterations. As just one example, the array A may have the following values: $A = \{2, 2, 4, 4, 5, 5, 6, 6, 8, 8\}$. Once this is established, one of the values of A is randomly selected. The targeted random value generation algorithm may operate consistent with the following pseudocode:

maximum local iteration value=$A$[random( )], where random( ) is the output of a random number generator circuit having a random value between zero and the Default Value. Such a random number generator circuit may be implemented, for example, as a free running counter. The value from random( ) serves as an index into the array A. In one particular embodiment of the present invention, the Default Value is ten (10), and the Threshold Value B is one hundred (100). The values of the Default Value, and the Threshold Value B may be changed to match the particular needs of a given embodiment of the present invention.

In addition, where modified decoding is selected and the global iteration requirements for either targeted or non-targeted randomization have been met, the decoder layer ordering is fixed (block 242). This may include fixing the ordering to the ordering used during the preceding local iteration, or to an ordering different from the preceding local iteration. Thus, when the modified decoding is selected, the ordering of the layered decoding is fixed and the maximum number of local iterations is modified. This perturbs the processing approach in an effort to dislodge the trapping set.

Figure 3:
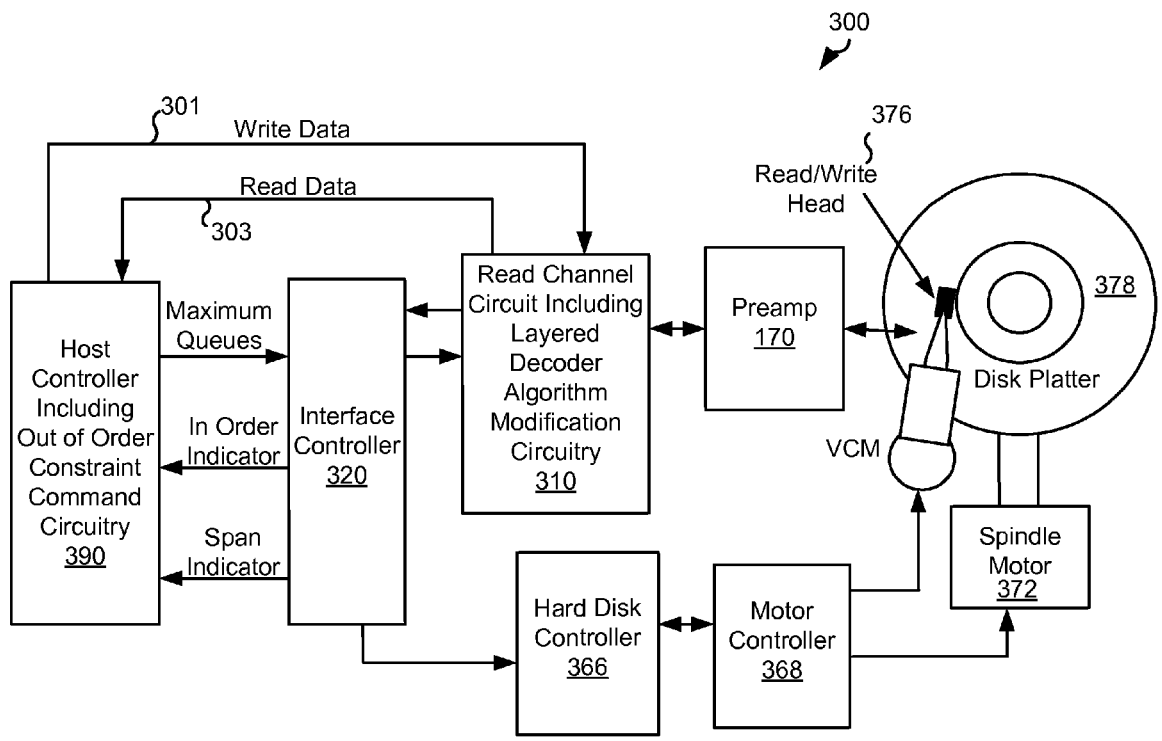
FIG. 3 shows a storage system including decoder iteration randomization and layered decoding circuitry in accordance with various embodiments of the present invention.

Turning to FIG. 3, a storage system 300 including a read channel circuit 310 having decoder iteration randomization and layered decoding circuitry is shown in accordance with various embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head 376. Interface controller 320 controls addressing and timing of data to/from disk platter 378, and interacts with a host controller 390 that may include out of order constraint command circuitry. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 376 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

As part of processing the received information, read channel circuit 310 applies a varying number of global iterations and local iterations to the received information. The decoder iteration randomization circuitry selectively modifies a maximum number of allowable local iterations where the possibility of a repeating error is high. In addition to modifying the number of local iterations, the ordering of a layered decoder is fixed. This combination of modifying the default number of allowable local iterations and fixing the ordering of the layered decoder may perturb the data processing sufficient to disrupt the error repetition and allow errors remaining in a decoded output to be resolved on subsequent processing iterations. In some cases, read channel circuit 310 may be implemented to include a data processing circuit similar to that discussed above in relation to FIG. 1. Further, the data processing implemented by receiver 495 may be implemented similar to that discussed above in relation to FIGS. 2a-2c.

It should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 310 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 300 may be modified to include solid state memory that is used to store data in addition to the storage offered by disk platter 378. This solid state memory may be used in parallel to disk platter 378 to provide additional storage. In such a case, the solid state memory receives and provides information directly to read channel circuit 310. Alternatively, the solid state memory may be used as a cache where it offers faster access time than that offered by disk platted 378. In such a case, the solid state memory may be disposed between interface controller 320 and read channel circuit 310 where it operates as a pass through to disk platter 378 when requested data is not available in the solid state memory or when the solid state memory does not have sufficient storage to hold a newly written data set. Based upon the disclosure provided herein, one of ordinary skill in the art will recognize a variety of storage systems including both disk platter 378 and a solid state memory.

Figure 4:
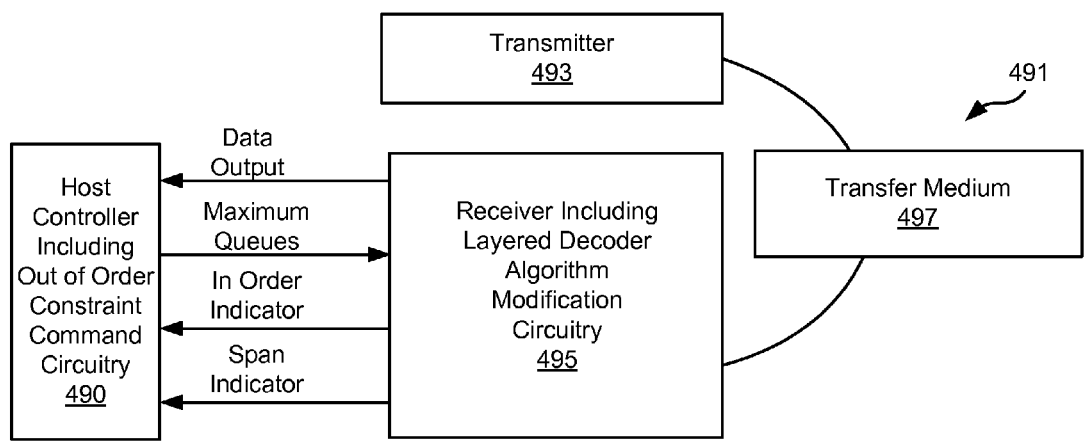
FIG. 4 depicts a data transmission system including decoder iteration randomization and layered decoding circuitry in accordance with one or more embodiments of the present invention.

Turning to FIG. 4, a data transmission system 491 including a receiver 495 having decoder iteration randomization and layered decoding circuitry is shown in accordance with various embodiments of the present invention. Data transmission system 491 includes a transmitter 493 that is operable to transmit encoded information via a transfer medium 497 as is known in the art. The encoded data is received from transfer medium 497 by a receiver 495. Receiver 495 processes the received input to yield the originally transmitted data.

As part of processing the received information, receiver 495 applies a varying number of global iterations and local iterations to the received information. The decoder iteration randomization circuitry selectively modifies a maximum number of allowable local iterations where the possibility of a repeating error is high. In addition to modifying the number of local iterations, the ordering of a layered decoder is fixed. This combination of modifying the default number of allowable local iterations and fixing the ordering of the layered decoder may perturb the data processing sufficient to disrupt the error repetition and allow errors remaining in a decoded output to be resolved on subsequent processing iterations. In some cases, receiver 495 may be implemented to include a data processing circuit similar to that discussed above in relation to FIG. 1. Further, the data processing implemented by receiver 495 may be implemented similar to that discussed above in relation to FIGS. 2a-2c.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a multi-layer layered data decoding circuit configured to iteratively apply a data decoding algorithm up to a selected number of times to a decoder input to yield a decoded output in accordance with a layer order;
   a value generator circuit configured to generate an adjusted number of times, wherein the adjusted number of times is less than a default number of times; and
   a selector circuit configured to select one of the default number of times and the adjusted number of times as the selected number of times.

2. The data processing system of claim 1, wherein the data processing system further comprises:
   a trapping set detection circuit configured to identify a potential trapping set in the decoder output.

3. The data processing system of claim 2, wherein the adjusted number of times is selected as the selected number of times, and the layer order is set based at least in part on identification of the potential trapping set.

4. The data processing system of claim 1, wherein the value generator circuit is configured to generate a random value provided as the adjusted number of times.

5. The data processing system of claim 4, wherein the default number of times is a first default number of times, and wherein a second default number of times is provided as the adjusted number of times for a first processing period, and wherein the random value is provided as the adjusted number of times for a second processing period.

6. The data processing system of claim 1, wherein the data processing system further comprises:
   a data detector circuit configured to apply a data detection algorithm to a data input to yield a detected output, wherein the decoder input is derived from the detected output, and wherein processing by both the data detector circuit and the data decoder circuit is a global iteration.

7. The data processing system of claim 6, wherein the data detector circuit is selected from a group consisting of: a Viterbi algorithm data detector circuit, and a maximum a posteriori data detector circuit.

8. The data processing system of claim 6, wherein the value generator circuit is configured to generate a value based upon a current number of global iterations, and to provide the value as the adjusted number of times.

9. The data processing system of claim 8, wherein the default number of times is a first default numbed of times, and wherein a second default number of times is provided as the adjusted number of times for a first processing period, and wherein the value is provided as the adjusted number of times for a second processing period.

10. The data processing system of claim 9, wherein the first processing period is between a first number of global iterations and a second number of global iterations, and wherein the second processing period occurs after the second number of global iterations.

11. The data processing system of claim 1, wherein the system is implemented as an integrated circuit.

12. The data processing system of claim 1, wherein the system is implemented as part of a device selected from a group consisting of: a communication device, and a storage device.

13. The data processing system of claim 1, wherein the multi-layer layered data decoding circuit is a low density parity check decoder circuit.

14. The data processing system of claim 1, wherein the selector circuit is further configured to set the layer order to a defined order when the adjusted number of times is provided as the selected number of times.

15. The data processing system of claim 14, wherein the defined order is the same order as a preceding iteration through the multi-layer layered data decoding circuit.

16. The data processing system of claim 1, wherein the defined order is different from an order of a preceding iteration through the multi-layer layered data decoding circuit.

17. A method for data processing, the method comprising:
iteratively applying a data decoding algorithm by a layered data decoding circuit to a data set up to a selected number of times to yield a decoded output, wherein the data decoding algorithm is applied in a layer order;
generating an adjusted number of times;
selecting one of a default number of times and the adjusted number of times as the selected number of times; and
setting the layer order to a defined order based at least in part on selecting the adjusted number of times.

18. The method of claim 17, wherein the method further comprises:
identifying a potential trapping set in the decoder output; and
based at least in part on the identified potential trapping set, selecting the adjusted number of times as the selected number of times, and setting the layer order.

19. The method of claim 18, wherein the random value is a pseudo random value, and wherein the method further comprises:
applying a data detection algorithm to a data input to yield a detected output, wherein the data set is derived from the detected output, and wherein processing by both the data detector circuit and the data decoder circuit is a global iteration; and
wherein the pseudo random value is generated based at least in part on a number of global iterations.

20. The method of claim 19, wherein the method further comprises:
assigning the default number of times as the adjusted number of times for a first processing period; and
assigning the pseudo random value as the adjusted umber of times for a second processing period.

21. The method of claim 20, wherein the first processing period is between a first number of global iterations and a second number of global iterations, and wherein the second processing period occurs after the second number of global iterations.

22. The method of claim 17, wherein generating the adjusted number of times includes generating a random value, and assigning the random value as the adjusted number of times.

23. The method of claim 22, wherein assigning the random value as the adjusted number of times occurs during a second processing period, and wherein the method further comprises:
assigning a default value as the adjusted number of times for a first processing period.

24. A storage device, the storage device comprising:
a storage medium;
a head assembly disposed in relation to the storage medium and configured to provide a sensed signal corresponding to a data set on the storage;
a read channel circuit including:
an analog front end circuit configured to provide an analog signal corresponding to the sensed signal;
an analog to digital converter circuit configured to sample the analog signal to yield a series of digital samples;
an equalizer circuit configured to equalize the digital samples to yield a sample set;
a data detector circuit configured to apply a data detection algorithm to a the sample set to yield a detected output;
a layered data decoding circuit configured to iteratively apply a data decoding algorithm up to a decoder input derived from the detected output a selected number of times to yield a decoded output in accordance with a layer order;
a value generator circuit configured to generate an adjusted number of times, wherein the adjusted number of times is less than a default number of times;
a selector circuit configured to select one of the default number of times and the adjusted number of times as the selected number of times, and to set the layer order to a defined order when the adjusted number of times is provided as the selected number of times.

* * * * *